US008719745B2

(12) United States Patent
Ting et al.

(10) Patent No.: US 8,719,745 B2
(45) Date of Patent: May 6, 2014

(54) METHOD AND SYSTEM FOR AUTOMATICALLY ESTABLISHING HIERARCHICAL PARAMETERIZED CELL (PCELL) DEBUGGING ENVIRONMENT

(71) Applicant: Cadence Design Systems, Inc., San Jose, CA (US)

(72) Inventors: Li-Chien Ting, Cupertino, CA (US); Nikolay Vladimirovich Anufriev, Moscow (RU); Alexey Nikolayevich Peskov, Moscow (RU); Serena Chiang Caluya, Pleasanton, CA (US); Chia-Fu Chen, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 36 days.

(21) Appl. No.: 13/686,560

(22) Filed: Nov. 27, 2012

(65) Prior Publication Data

US 2013/0298092 A1    Nov. 7, 2013

Related U.S. Application Data

(63) Continuation of application No. PCT/RU2012/000273, filed on May 2, 2012.

(51) Int. Cl.
*G06F 17/50*    (2006.01)
*G06F 9/455*    (2006.01)

(52) U.S. Cl.
USPC ........... 716/111; 716/102; 716/106; 716/112; 716/119; 716/126

(58) Field of Classification Search
USPC ......... 716/102, 106, 107, 110, 112, 111, 118, 716/126, 139
See application file for complete search history.

(56) References Cited

U.S. PATENT DOCUMENTS

| 8,370,786 | B1* | 2/2013 | Burstein ................. 716/134 |
| 2003/0093504 | A1* | 5/2003 | Neunhoeffer et al. ....... 709/220 |
| 2004/0229200 | A1 | 11/2004 | McKeon et al. |
| 2005/0268268 | A1* | 12/2005 | Wang et al. ................ 716/9 |
| 2010/0287519 | A1* | 11/2010 | Su .......................... 716/10 |
| 2011/0061034 | A1* | 3/2011 | Ginetti et al. ............. 716/104 |

FOREIGN PATENT DOCUMENTS

| EP | 2336920 A2 | 6/2011 |
| RU | 2336557 C2 | 10/2008 |

* cited by examiner

*Primary Examiner* — Vuthe Siek
*Assistant Examiner* — Brian Ngo
(74) *Attorney, Agent, or Firm* — Rosenberg, Klein & Lee

(57) ABSTRACT

A system and method are provided for establishing an automated debugging environment in an Electronic Design Automation (EDA) work flow for the debugging of parameterized cells (PCELLS/PyCELLS) in a layout. A user may merely select a particular PCELL within a hierarchical PCELL and the system and method will determine dependencies thereof. The source code for the selected PCELL and its dependencies may be located and loaded. At least one breakpoint may be set in the source code of the selected PCELL. The source code for the selected PCELL and its dependencies may be executed to be arrested at the set breakpoints. Upon the arrest of execution, a debugging environment may be established and the located source code of the selected PCELL may be displayed along with values for parametric components thereof and progression control tools.

22 Claims, 15 Drawing Sheets

FIG. 7

METHOD AND SYSTEM FOR AUTOMATICALLY ESTABLISHING HIERARCHICAL PARAMETERIZED CELL (PCELL) DEBUGGING ENVIRONMENT

RELATED APPLICATIONS

This application is a "Bypass" Continuation Patent Application of co-pending US application number: PCT/RU2012/000273 filed 2 May 2012 (under 35 USC §§111, 120 and 363, et seq.).

BACKGROUND OF THE INVENTION

The subject system and method are generally directed to automatically establishing a user-friendly, efficient, and effective debugging environment for electronic design automation (EDA) software environments. The system and method provide automated measures for interacting with a developer, providing a user with a debugging environment that is automatically generated responsive to a designer merely selecting an object or cell in a design. The system and method automatically determine which other cells in a hierarchy are required by the selected cell, locate their source code portions and the source code for the selected cell, and form a set of source code portions therefrom. Once the set of source code portions has been established, at least one breakpoint is set at a location of the source code for the selected cell. The set of source code portions may then be executed to generate at least one parameter for the selected cell. Upon reaching the set breakpoint, a debugging user interface is provided to the user that displays at least the source code for the selected cell and a value of the parameter therefor. Additionally, controls that provide the user with selective control over the progression of the execution of the source code of the selected cell may be provided. The system and method thereby enable and provide an automated debugging environment for hierarchical cell development.

As electronic design automation (EDA) and circuit design are becoming more and more intricate and complex, the demand for interoperability of designs, design houses, and support products is increasing. Re-usability of code, schematics, and quick, efficient, and potent debugging and designing tools are becoming increasingly essential. In performing the layout or silicon realization by a designer, such a task is rarely manually performed, but is instead automated through the use of parameterized cells (PCELLS including SKILL PCELLS and PyCells, for simplicity used interchangeably herein though PyCells may be implemented with minor differences, such as by a python language). PCELLS are not statically defined objects, but instead are dynamically defined, at least in part, by portions of source code which may be written in SKILL, Python, Tool Command Language (Tcl), SCHEME, Lisp, C, C++, Java, or any computer programming or scripting language as known to one of skill in the art (using library functions from Component Description Format (CDF) or Interoperable CDF (iCDF)). While the source code for a given PCELL is generally written in SKILL or a Lisp-based language, the source code for a PyCell is generally written in Python. The PCELLS are generally instantiated dynamically according to callback functions defined by their source code and according to parameters that are passed to the source code during instantiation. The parameters may illustratively come from a user, an application, a debugger, or from an evaluation of other PCELLS/PyCells. To achieve design goals, a hierarchal PCELL may be created to have a hierarchy of layers of PCELLS therein collectively forming the hierarchical PCELL. The PCELLS on a given level n, may, illustratively, receive parametric input from PCELLS on levels n, n-1, n-2, n-3 . . . etc.

Such PCELLS/PyCells are generally provided by a fabrication house or foundry, such as, for example: Taiwan Semiconductor Manufacturing Company (TSMC), which may often provide a collection of PCELLS or PyCells as a process design kit (PDK), interoperable PDK (iPDK), PCELL/PyCELL library, or library of components to be used to form any cell in a given design. A PDK developer for a fabrication house will create this PDK for an end user, such as a circuit layout designer, who will use the PDK or library to automatically generate, for example, a layout based on a circuit schematic, adding in parameters, as needed, for the design relying on the PDK. Therefore, for a circuit designer to successfully generate a layout with the PDK, a PDK developer will need to debug mistakes or errors in the PDK which would propagate in to the layout generation. The system and method may indeed be employed to enable and facilitate automated debugging in any environment that employs dynamically instantiated hierarchical objects. The present invention is not limited by the exemplary computer programming languages illustrated herein, data formats, or exemplary application packages featured herein.

Conventionally, a developer of the PDK would need to generate and inspect a test layout, find the errors or mistakes, and determine which PCELL the mistakes or errors belong to. Then, the developer would need to attempt to locate (within a vast library of different PCELLS and source code files) where the particular source code portion which instantiates instances of that PCELL and/or sets parameters of that cell is located. The developer would then need to open the correct source file, traverse to the portion relating to the problematic PCELL, manually insert a break point, and establish a debugging interface which will execute the PCELL source code in a debugging mode. While this may seem a trivial matter, many factors, layers, levels, transformations, languages, and abstractions complicate the matter. Indeed, the original source code for the PCELL objects may be transformed from its original form into an intermediate representation and then obscured in a database format in this transformed manner at run-time. In an exemplary definition of a PCELL, the source code for the PCELL may be extracted, converted, and placed inside a procedure of a debugging engine, such as SKILL, and stored in a database, such as, for example, an OpenAccess Database. Additionally frustrating the debugging, the source code for the PCELL may make calls to PCELL support files which are not contained in the source code for the PCELL and are, therefore, not located in the database. Therefore, it is no small task to locate and debug the source code, support files, and interdependencies for a particular PCELL that can be buried in any of potentially thousands of source code files.

In the event of an error during the test layout generation, a developer, conventionally, has been forced to abandon the layout, search through massive amounts of code to locate where the problem is, and attempt to debug the situation manually through the insertion of break points, callouts, traces, and other such debugging tools and measures, as known to one of skill in the art. Such distractions can prove costly and time consuming in the overall EDA design flow, especially considering the iterative nature of such a design flow. Such problems are naturally exaggerated and compounded when the layout contains parameterized cells (PCELLS) such that the characteristics or parameters of a given PCELL are not fully established until the layout is actually generated. When a developer chooses or is required to make use of PCELLS within PCELLS, nested PCELLS, or a hierarchy of PCELLS, the situation becomes exponentially more complex given the fact that any PCELL may have parameters that are determined by an evaluation of other PCELLS within the hierarchy of PCELLS. Such a design, while providing many benefits stemming from the dynamic nature, may resemble a complicated web of intricate interdependencies.

There is therefore a need for a system and method for automatically debugging PCELLS in a layout. There is a need for a system and method which provide an interface for a developer to select a problematic PCELL and have the source code files related thereto automatically identified and displayed. There is a need for a system and method to automatically determine interdependencies in a hierarchical PCELL. There is a need for a system and method to automatically generate, traverse, and evaluate the interdependencies within a hierarchical PCELL to correctly generate parameters for a selected PCELL. There is a need for a system and method to set a breakpoint in a source code portion for the selected PCELL, load the source code portion, and present the relevant portion to the user while intelligently omitting portions of the source code which the user did not code or which are unlikely to be of interest. There is a need for a system and method to automatically set a break point at a relevant portion of the located source code for the selected PCELL and provide the user with an integrated debugging environment to enable the developer to evaluate and remedy problems with the source code such that the generation of a layout or circuit realization may be efficiently debugged while not adding substantial distractive and interruptive tasks for an otherwise efficiently engaged developer. It is to be understood that the description of the exemplary embodiments below are not intended to limit the scope of the present invention to EDA embodiments or to any particular environment, application, language, or format.

SUMMARY OF THE INVENTION

It is an object of the present invention to provide a system and method for automatically establishing a debugging environment for a developer of hierarchical parameterized cells (PCELLS or PyCells).

It is another object of the present invention to provide a system and method for automatically locating source code files and support files related to a selected PCELL.

It is yet another object of the present invention to provide an automated intelligent breakpoint management system for debugging PCELLS.

It is yet another object of the present invention to provide measures for overloading of parameterized cell instantiation, modification, and removal functions.

It is yet another object of the present invention to provide a debugging system which enables a user to debug a PCELL within any hierarchical level of a hierarchical parameterized cell, though any level other than the master level may depend on levels anteceding.

It is yet another object of the present invention to provide a debugging system which identifies a set of interdependencies among PCELLS within a hierarchical PCELL and executes the set to provide input to a selected PCELL to enable arbitrary debugging thereof.

A method realized in accordance with the present invention comprises establishing a debugging user interface for a cell within an interdependent hierarchy of cells in an integrated circuit (IC layout) including: establishing a data store of source code portions, each source code portion defining at least part of a cell. A user interface is actuated to accept a user selection of at least one cell in an integrated circuit (IC) layout, the layout includes at least one hierarchical cell having a hierarchy of subordinate cells formed therein, each subordinate cell being collectively defined by a corresponding source code portion in the data store and at least one parametric component derived from at least one other cell within the hierarchy. A computer processor is actuated to identify a source code portion corresponding to the selected cell. A breakpoint is then established responsive to the user selection at a predetermined location of the source code portion corresponding to the selected cell. A set of source code portions are then executed to establish at least a portion of the hierarchical cell containing the selected cell to thereby generate a value for at least one parametric component of the selected cell. Execution is then arrested at the breakpoint. The source code portion corresponding to the selected cell and the value for the at least one parametric component of the selected cell are then displayed to the user.

Another method realized in accordance with the present invention comprises: establishing a data store of source code portions, each source code portion defining a cell template, the source code portions being executable to establish cells in an Integrated Circuit (IC) design based on a corresponding cell template. An IC design is provided including at least one hierarchical cell having a hierarchy of levels contained thereon of dependent cells, each of the dependent cells are collectively defined by a cell template in the data store and at least one parametric component derived from an evaluation of at least one other cell within the hierarchy. A user interface is actuated to accept a selection of at least one cell within a hierarchical cell in the IC design. A set of cells that the selected cell depends upon are selected and the set of source code portions therefore are loaded. At least a part of the set of source code portions is executed to generate a value of at least one parametric component for the selected cell. The execution of the set of source code portions is arrested at a predetermined location therein. The user interface is actuated to display the source code portion corresponding to the selected cell and the value of the at least one parametric component of the selected cell derived from an evaluation of at least one other cell within the hierarchical cell.

A system realized in accordance with the present invention comprises: a memory storing a plurality of source code portions, each source code portion defining at least part of a cell. A user interface is functionally coupled to the memory and operable to accept a selection from a user of at least one cell in an IC layout. The layout includes at least one hierarchical cell having a hierarchy of subordinate cells formed therein with each subordinate cell being collectively defined by a corresponding source code portion in the memory and at least one parametric component derived from at least one other cell within the hierarchy. A computer processor is functionally coupled to the user interface and memory, the computer processor being operable to: identify a source code portion in the memory corresponding to the selected cell; establish a breakpoint responsive to the user selection at a predetermined location of the source code portion corresponding to the selected cell; execute a set of source code portions to establish at least a portion of the hierarchical cell containing the selected cell to generate a value for at least one parametric component of the selected cell; arrest execution at the breakpoint; and display to a user the source code portion corresponding to the selected cell and the value for the at least one parametric component for the selected cell via the user interface.

Additional aspects and utilities of the present general inventive concept will be set forth in part in the description which follows, and, in part, will be apparent from the description, or may be learned by practice of the general inventive concept.

BRIEF DESCRIPTION OF THE DRAWINGS

FIG. 7 is yet another exemplary user interface illustrating a selection of a PCELL in the layout file, its corresponding parameters, and source code for instantiating the PCELL;

DETAILED DESCRIPTION OF THE PREFERRED EMBODIMENTS

Figure 1A:
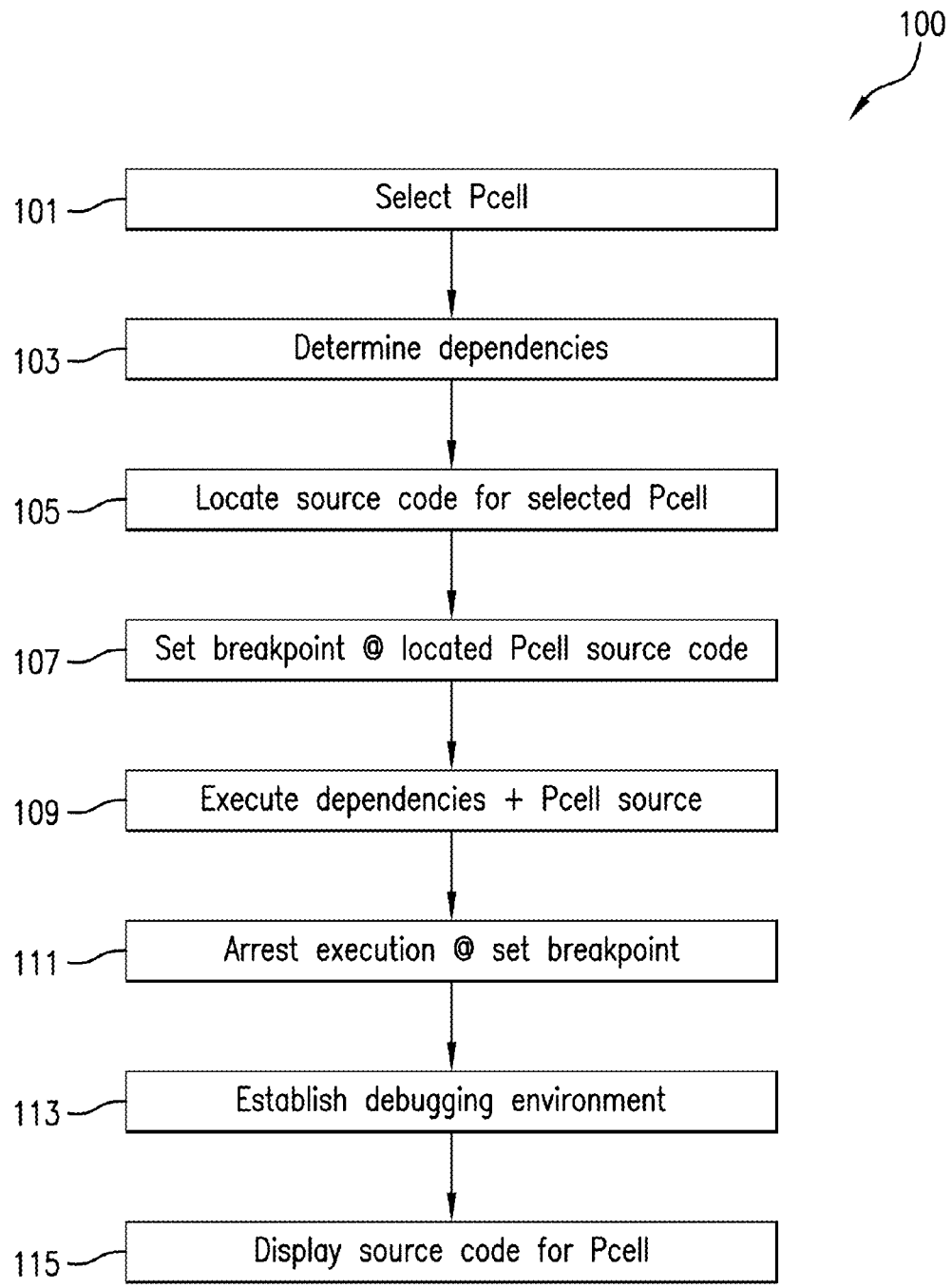
FIG. 1A is a simplified flow diagram illustrating an exemplary debugging and test layout-silicon realization flow of an EDA process.

Reference will now be made in detail to the embodiments of the present general inventive concept, examples of which are illustrated in the accompanying drawings, wherein like reference numerals refer to the like elements throughout. It is to be understood that the term invention, when used herein, refers to the general inventive concept underlying the exemplary embodiments described below and that the inventive concept is not limited to such illustrative embodiments themselves.

Systems, components, integrated circuits (ICs), microchips, systems-on-chip, and the like, may be modeled in a variety of different ways in an electronic design automation (EDA) flow. For example, some of the ways of modeling a system include a merely logical schematic diagram which omits all physical characteristics or dimensionality and merely shows simplified or abstracted representations of components or cells within the device.

Another manner of representing a system is a physical layout which shows an almost fully elaborated schematic with actual physical components representing their actual physical dimensionality and which are laid out in a topographical manner as they are intended to be actually physically realized on a silicon circuit-bearing-medium by a fabrication house or foundry. While the logical schematic is very conceptual and abstracted, the generation of a more specific and fully laid-out physical layout from the abstracted schematic is necessary for circuit design to conclude with a physical working product.

Rather than recreating a new schematic in each instance that a new layout is required, it is desirable to enable reuse of the abstracted schematic to dynamically generate layouts for the given situation. To do so, a user interface is provided to accept values for PCELLS from any of: a user, other PCELLS, another program, the schematic, a script, various support files, or the like, to populate the parameters for the individual PCELLS or components (as defined by a given process design kit (PDK) or source code files) that will be used to generate the layout from the schematic. However, in attempting to dynamically generate a silicon realization or layout from the abstracted schematic in concert with the source code, support files, and the parameters, problems or bugs will almost certainly be encountered.

A system and method realized in accordance with the present invention seeks to dramatically reduce the problems with implementing such PCELLS and provide a framework for developers to evaluate, debug, and repair the problems with the generation of the layout through the use of the parameterized cells without distracting designers from the design flow.

As seen in the illustrative simplified flow chart of FIG. 1A, a PCELL is selected at block 101. Such selection may be from a generated test layout, a list of PCELLS in a given design, or other such measures for accepting a selection of a PCELL. The PCELL may be selected from a first level of a design or from any arbitrary level; indeed, the PCELL may be selected from within another PCELL, such as an hierarchical PCELL.

At block 103, the dependencies for the selected PCELL may be determined. If, for example, a PCELL is selected from a third level of a hierarchical PCELL, such as PCELL E 159 in FIG. 1C, then it may be determined that PCELL E is dependent not only upon PCELL A 150, PCELL B.1 151, PCELL B.2 152, and PCELL C 153, but also upon PCELL D 158. In turn, each of PCELL A 150-PCELL D 158 (and PCELL E 159) may have individual source code files, support files, inclusions, incorporations by reference, and the like which are necessary to fully generate the selected PCELL. Yet further, each of the individual PCELLS may require at least one parameter to be instantiated. Such parameters may not even be determinable until the entire hierarchy up to a given PCELL has been fully instantiated. In a preferred embodiment, all of the objects from which the selected PCELL depends will be identified.

At block 105, the source code for the selected PCELL will be located. Such location may be in the form of soliciting a path and filename or canonical location from a user, via a search, a query from a database or data store, following a predetermined storage scheme, or any other measure as would be known to one of skill in the art.

At least one breakpoint will be set at block 107 for the located source code for the selected PCELL. Such breakpoint may be set through a transformation of the source code to include an additional command, through a separate file maintaining breakpoints, a database, through the debugging engine, the integrated development environment (IDE), a layout generation program, or the like, as would be known to one of skill in the art. In an embodiment where the layout generation program has predefined functions to instantiate PCELLS in the layout, such as dbCreateParamInst or the like, such functions may be overloaded such that a different version of the function is executed when it is determined that the layout generation program is in a debugging mode. Such overloaded functions may be registered with the layout generation program or the IDE. In one embodiment only one breakpoint is set. Such breakpoint may be set at the entrance to the user's source code for the selected PCELL. Alternatively, a user may manually set breakpoints at locations in the source code that they wish to evaluate. In another alternative embodiment, a plurality of breakpoints are automatically generated to be at, for example: each instantiation of a PCELL, or the like, as would be known to one of skill in the art.

Once the breakpoints are set, the PCELL source code for the selected PCELL, and anything which the selected PCELL depends on will be executed. Such execution may be through a compilation, assembly, transformation, or merely a script which is 'run' by an interpreter as would be known to one of skill in the art. 'Executed' herein merely means that the instantiation, assignment, evaluative, and other commands, instructions, or expressions in the source code are carried out. How they are carried out is beyond the scope of the present invention. It is through the execution of each of the PCELLS that the selected PCELL depends from that values for the parametric components of the selected PCELL are generated. Such generation may be through an evaluation of the characteristics of the PCELLS within the hierarchy that the selected PCELL depends upon.

As an illustrative example of such dependencies:
1. PCELL B takes parameter "finger" to create an nmos transistor device.
2. PCELL C takes parameter "area" to create a guard-band surrounding the given area of width which is determined by "bands."
3. PCELL A:
   a. takes parameter "w" and uses its value to compute "finger";
   b. takes computed "finger" value and uses it to create an instance of PCELL B;
   c. after placement of B, queries the database for B's area (bounding box);
   d. takes computed "area" value and uses it to create an instance of PCELL C.

At block 111 the execution of the selected PCELL source code is arrested at the set breakpoint. If the breakpoint is set at the entrance to the PCELL source code, then the source code of the selected PCELL will not initially run. Such arresting of the execution may be invaluable to a developer or designer in starting the debugging process. Initial variable, constant, memory space, and parametric component values may be determined before they are acted upon. A whole host of problems may thusly be evaluated before they propagate to cause other failures. Arresting execution of the source code at this stage may be considered akin to arresting the building of a house at the construction of the foundation.

Figure 5:
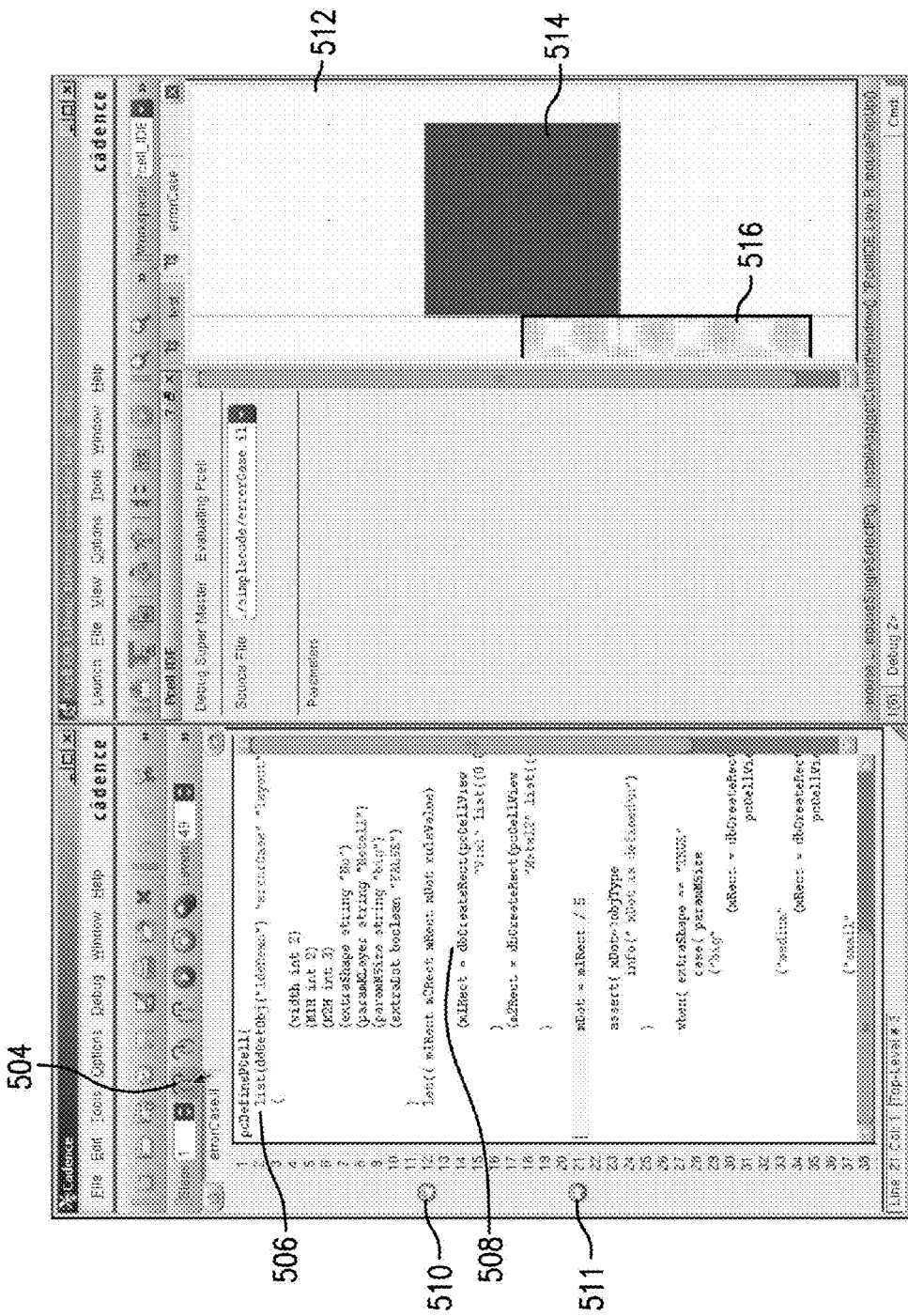
FIG. 5 is another exemplary user interface detailing a debugging flow of the source code as it effects the generated layout file.

At block 113, a debugging environment may be established (such as seen in FIG. 5) to include a display of the source code for the selected PCELL, an indication thereon of where execution has been arrested, values for parametric components of the selected PCELL, and a progress control portion. The progress control portion may allow the user to continue execution of the code, step to the next line/statement, or step to the next expression. In a given statement, having multiple expressions, such as: 'a=b+c+d,' the statement is made up of expressions such as: 'b+c,' '((b+c)+d),' or the assignment of the total value to 'a.'

At block 115, the source code for the selected PCELL is displayed. In a preferred embodiment, the source code for the dependencies are intelligently skipped. Thereby, the support files, the source code for PCELLS which the selected PCELL depends from, and the like are omitted from display—while the source code for the selected PCELL is displayed for the user to see and manipulate.

Figure 1B:
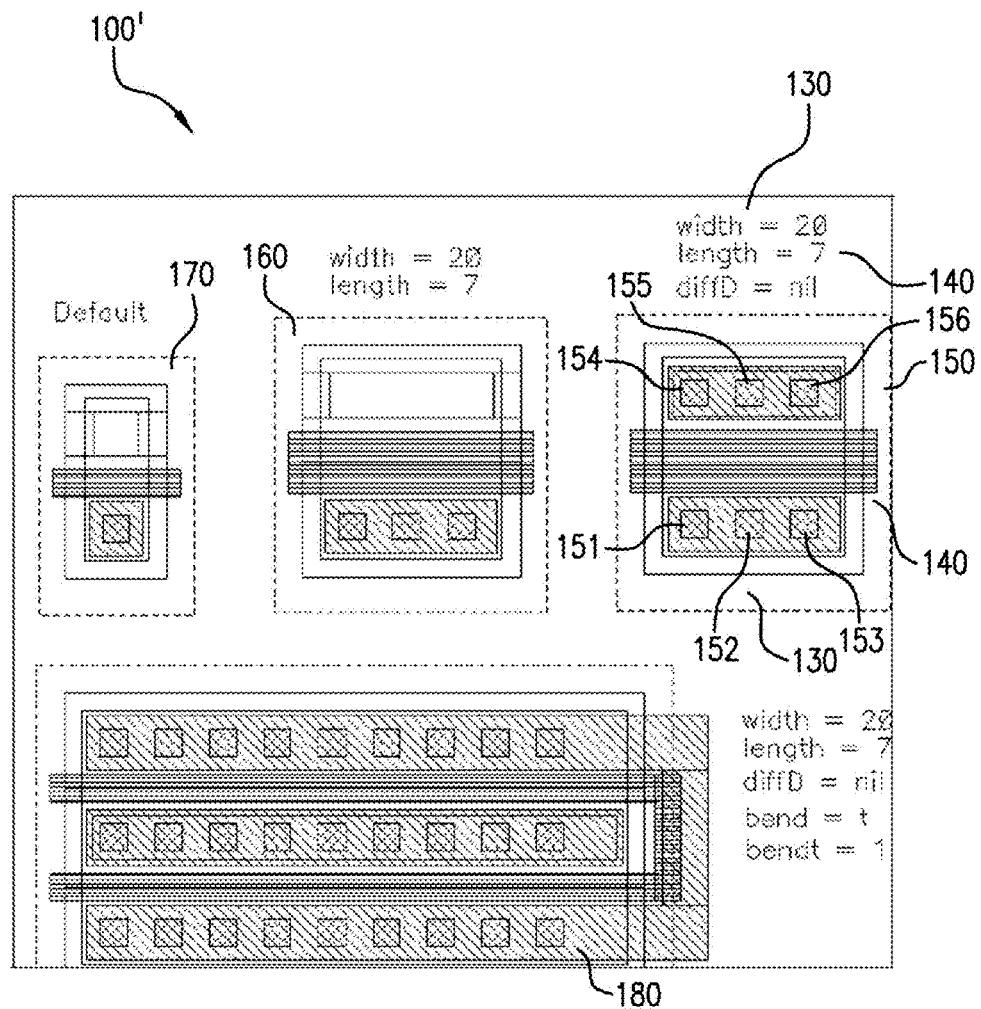
FIG. 1B is an illustrative example of a generated physical test-layout or silicon realization of an integrated circuit (IC) device generated in accordance with an exemplary embodiment of the present invention.

As seen in the exemplary layout diagram of FIG. 1B, a plurality of different PCELLS are illustrated, each being successfully generated in a graphical representation. Each PCELL has a plurality of different parameters collectively defining at least a portion of each cell. Layout 100' includes a plurality of different cells 150, 160, 170, and 180. Exemplary cell 150 includes two illustrative parameters, width 130 and length 140. Such parameters 130 and 140 may be thought of as parameter components inasmuch as cell 150 has a plurality of different embodiments, such as: a source code embodiment, a schematic object embodiment, a physical layout embodiment, a silicon realization mask embodiment, and a physical tangible chip embodiment. Therefore, in a software or code representation embodiment, the parameters may actually be defined by memory locations or variables which are used to store the actual parameters such as width, length, finger numbers, and the like. The various parameter components 130 and 140 are represented in a graphical form in the exemplary layout 100' as a width parameter 130' and a length parameter 140'. Each individual cell, e.g., 150, 160, 170, and 180, of the exemplary layout 100', as discussed above, is dynamically generated from the combination of an abstracted schematic file, a PDK or source code file, and a set of parameters for each individual cell set by a designer. Combining schematics with parameterized cells in the PDK leverages the logical, abstract nature of the cell captured in the schematic, while allowing the individual physical attributes or parameters necessary for the specific implementation of the cell to be determined further down the line and more proximate to the actual silicon realization. Thereby, the bulk of the logical schematic is able to be reused while allowing for a layout that is still able to be narrowly tailored for any given situation.

Figure 1C:
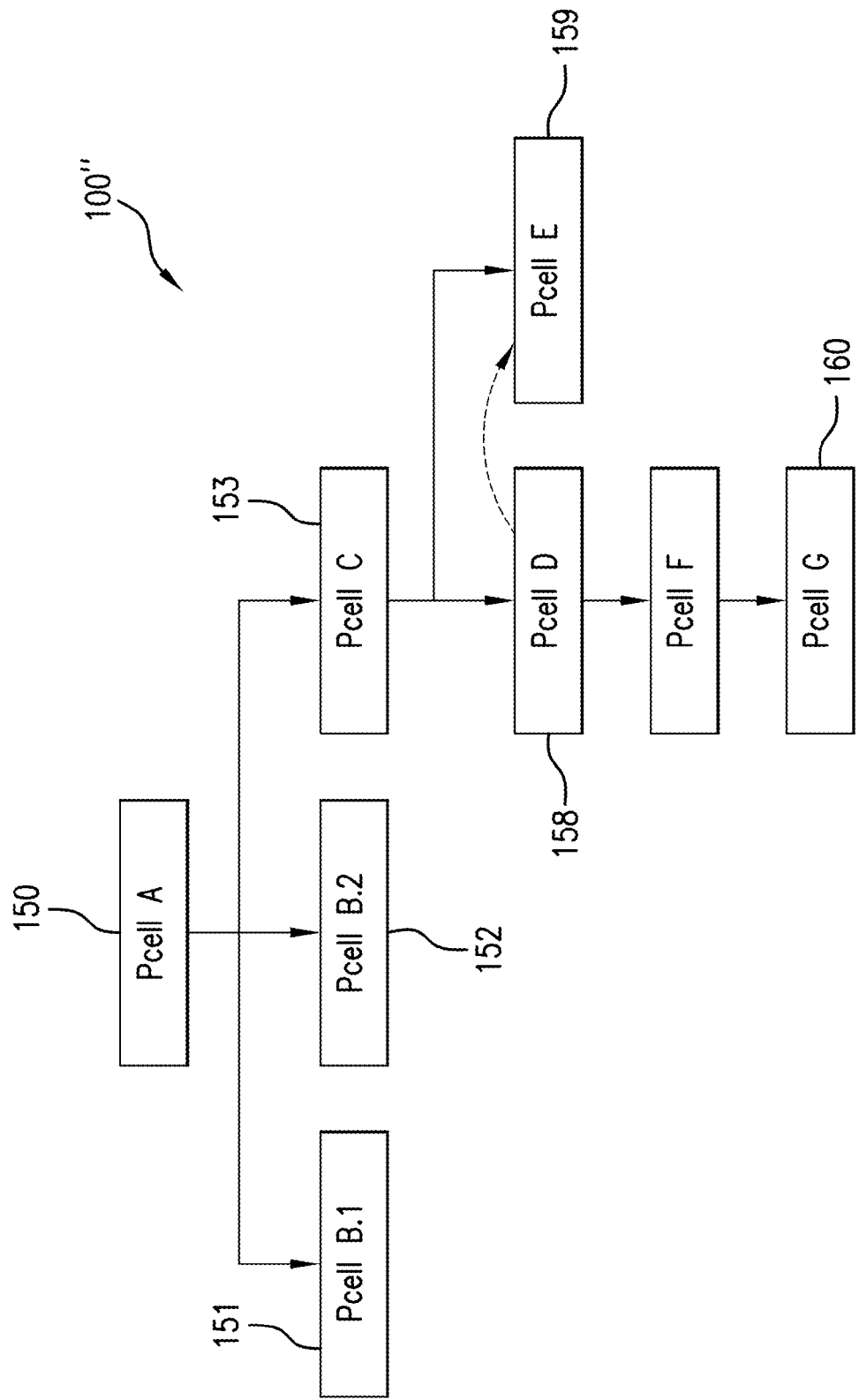
FIG. 1C is an exemplary hierarchical parameterized cell (PCELL) demonstrating an interdependency between PCELLS.

FIG. 1C is a highly simplified exemplary illustration of a hierarchical parameterized cell (PCELL) 100" which has PCELL A 150 which has a plurality of dependent PCELLs such as PCELL B.1 151, PCELL B.2 152, PCELL C 153, and every hierarchically dependent PCELL such as PCELL D 158, PCELL G 160, and PCELL E 159. PCELL 100" is not a static entity, but is instead a dynamically instantiated cell taking parameters as input for each of the PCELLs in the hierarchy. So, to merely instantiate, in a vacuum, PCELL G 160, would not likely be easily accomplished as PCELL G 160 is dependent upon the PCELL A 150, the dependent PCELL C 153, PCELL D 158, and any other intervening PCELLs between PCELL A 150 and the instantly desired PCELL G 160.

Indeed, not only is a given PCELL dependent upon parameters or the PCELLs that precede it, but also a given PCELL, such as PCELL E 159 that may be dependent upon its peers, such as PCELL D 158. PCELL E may depend upon parameters or values of other PCELLs in its hierarchical level. A given hierarchical PCELL may have many levels, such as eight, and each level may have many peer PCELLs, such as 100. As any given PCELL is dynamically generated with parameters and the given PCELL is potentially dependent upon many other different dynamically generated entities, problems may indeed appear quite frequently and debugging a given PCELL instance may be a very difficult task, especially considering the dynamically independent nature of a given PCELL. In the instant simplified exemplary hierarchical PCELL structure, it may be seen that PCELL B.1 151 and PCELL B.2 152 may indeed share the same source code, but be populated with different parameter values that result in different cells.

In another example, if a user were to notice a problem with the generated layout of the PCELL B.2 152, a user would first need to evaluate PCELL A 150 and PCELL B.1 151. In yet another example, if a user were to need to debug PCELL E 159, following a depth-first evaluation, a user would need to evaluate all of the PCELLs such as PCELL A 150, PCELL B.1 151, PCELL B.2 152, PCELL C 153, PCELL D 158, and PCELL G 160 to arrive at PCELL E 159. In such a hierarchical PCELL having, for example, fourteen levels, and hundreds of instances of peers per level, with each PCELL instance of the hierarchy having its own source code file and support files, debugging such a hierarchical PCELL may become a herculean task.

Figure 2:
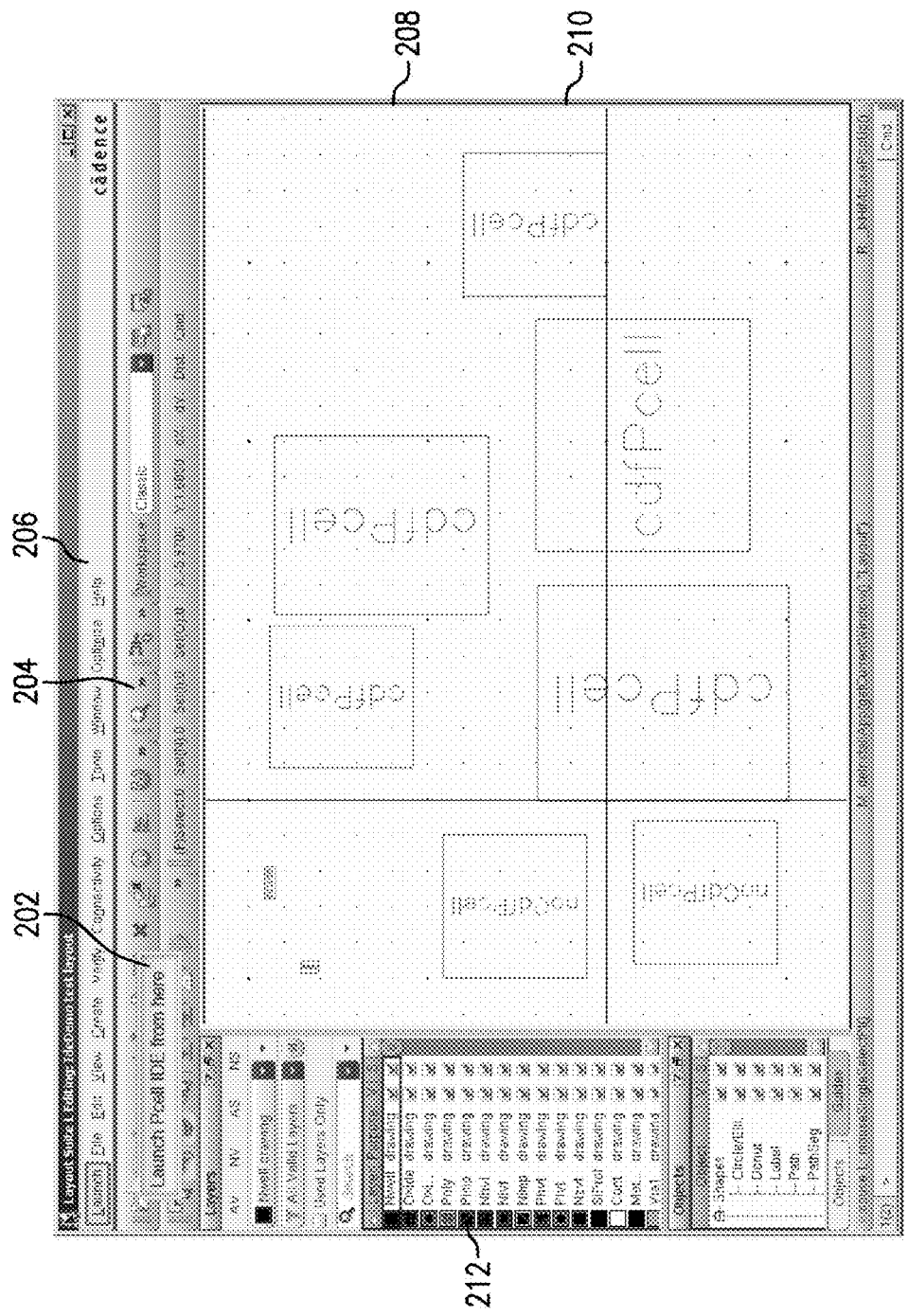
FIG. 2 is an exemplary screen shot of a user interface in accordance with an exemplary embodiment of the present invention.

As seen in FIG. 2, an exemplary user interface is shown. Such user interface may include a file menu 206 which is able to be manipulated by the user. The file menu may include a command, such as 'Launch PCELL IDE' 202 which may launch a debugging interface. A toolbar 204 may include shortcut icons to execute predetermined commands, configure the user interface, or the like. A viewing window for viewing, for example: a schematic, a layout 208 having PCELLS 210, a mask, or the like may also be provided. Additionally, a level control 212 may enumerate and display individual levels of the layout 208. Each individual level may be selectively displayed or hidden.

Figure 3:
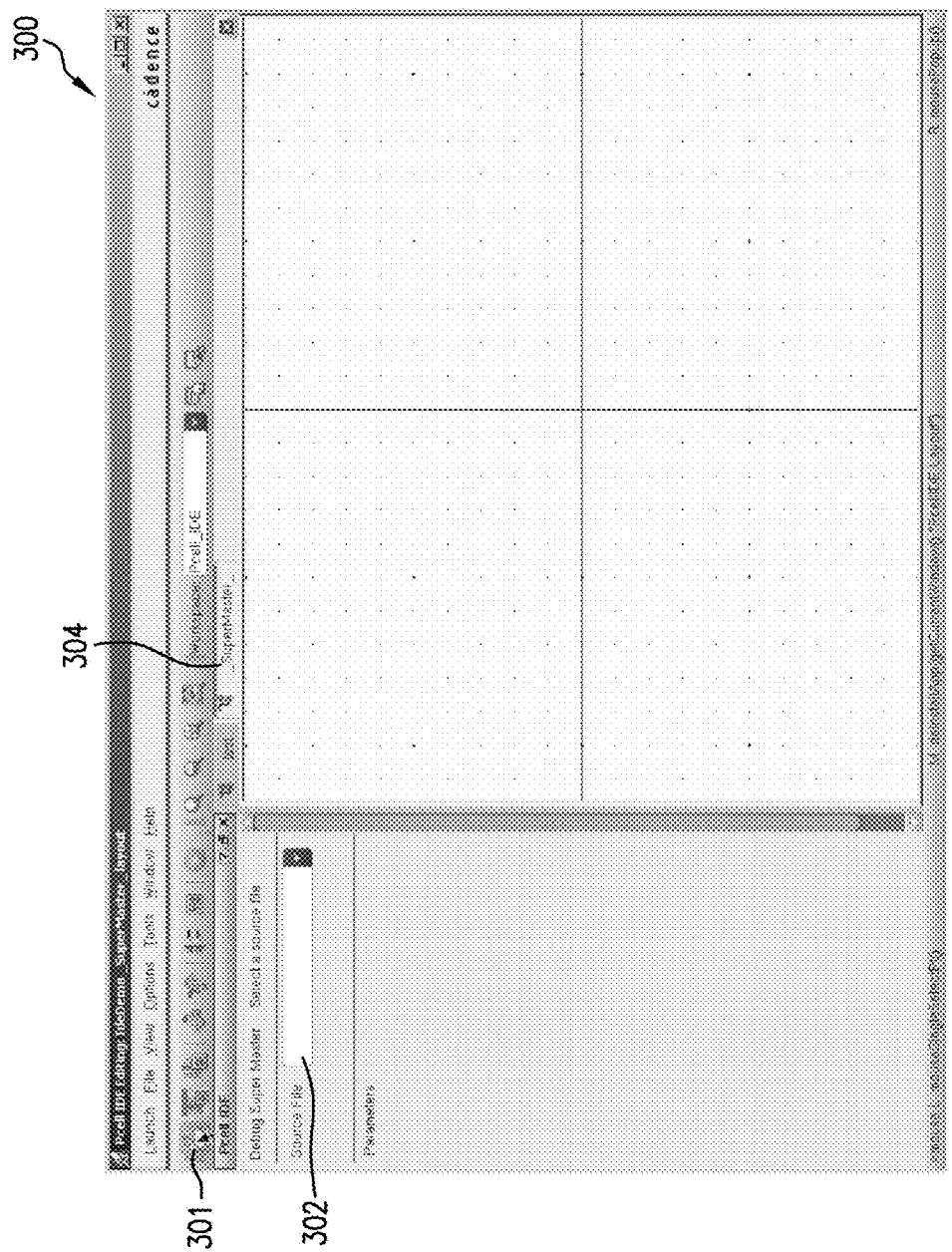
FIG. 3 is another exemplary screen shot of a user interface in accordance with an exemplary embodiment of the present invention.

As seen in FIG. 3, an exemplary portion of a user interface 300 realized in accordance with an exemplary embodiment of the present invention is shown. Such user interface may provide a plurality of different menus, toolbars, graphical user interface elements, as well as extensible plug-ins which further the functionality of such a user interface or tool. It is seen that in a preferred embodiment that a plug-in menu tool be provided to allow a user to select the debugging of the hierarchical parameterized cells (PCELLS) such that a user interface and integrated design or debugging environment (IDE) may be provided to the user. Initially a user may actuate an icon or menu structure 301 to open a PDK or source code file. A user may then actuate another graphical component such as 302 to choose a source code file. A plurality of windows 304, sheets, levels, or the like may be provided to the user. An exemplary sheet 304 is shown as a graphical layout which may be operable to display a layout schematic such as detailed in FIG. 1B. As no source code file 302 has been provided yet, the layout representation 304 may be empty.

Figure 4:
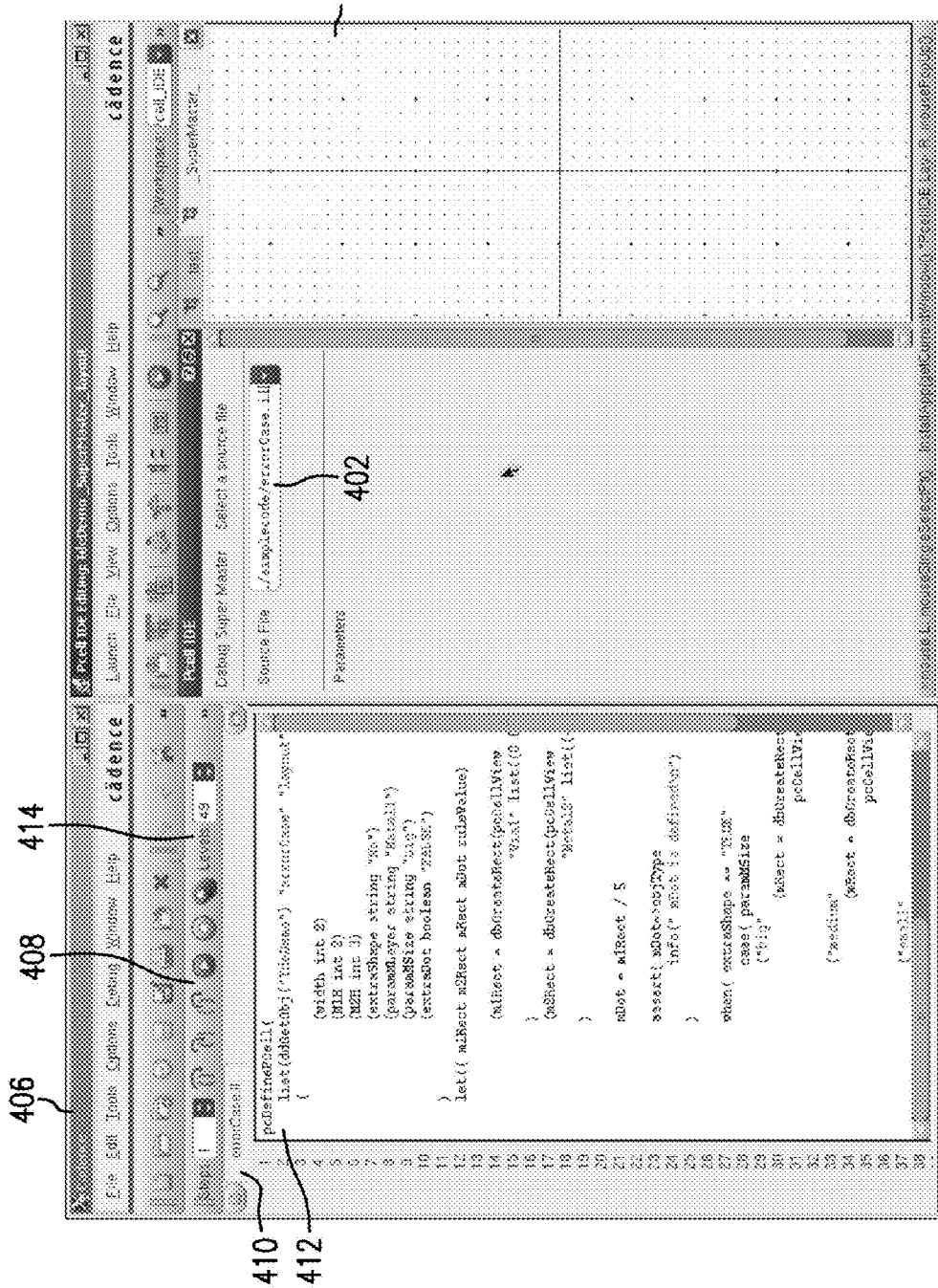
FIG. 4 is an exemplary user interface illustrating source code, a corresponding layout, and a source code file.

As seen in FIG. 4, a user has selected a source code file 402 which has populated a window 410 or sheet detailing the source code 412 of the selected source code 402. The source code 412 may be shown in a new debugging application, window, or portion of the user interface 406. Were a user to merely actuate the run command 408, the source code may be executed in its entirety and a generated graphical representation of a layout file would be instantiated and displayed to the user. Such user interface 406 may provide for a level control 414 which allows a user to traverse through the hierarchical PCELL.

As seen in FIG. 5, the execution of the source code 506 has progressed to Line 21 as indicated by indicia at 511 and highlighting of the current command "mDot=m1Rect/5." As source code 506 is executing, several 'dbCreateRect' function calls have been performed to generate geometric cell shapes such as cell 514 in the layout view 512. Additionally, another illustrative cell shape 516 is also seen in the layout view 512. As the user progresses through the source code 506 using the next, continue, step, step into, or step out of commands, illustratively shown as icon 504, the source code progresses to create the geometric shapes which will eventually be etched into silicon to form physical chips. Additionally, it is seen that through the progression of the execution of the source code, a break point 510 has been set at the "let" command. Such break point 510 allows the execution to stop, arrest progress, and maintain a system and layout state.

Figure 6:
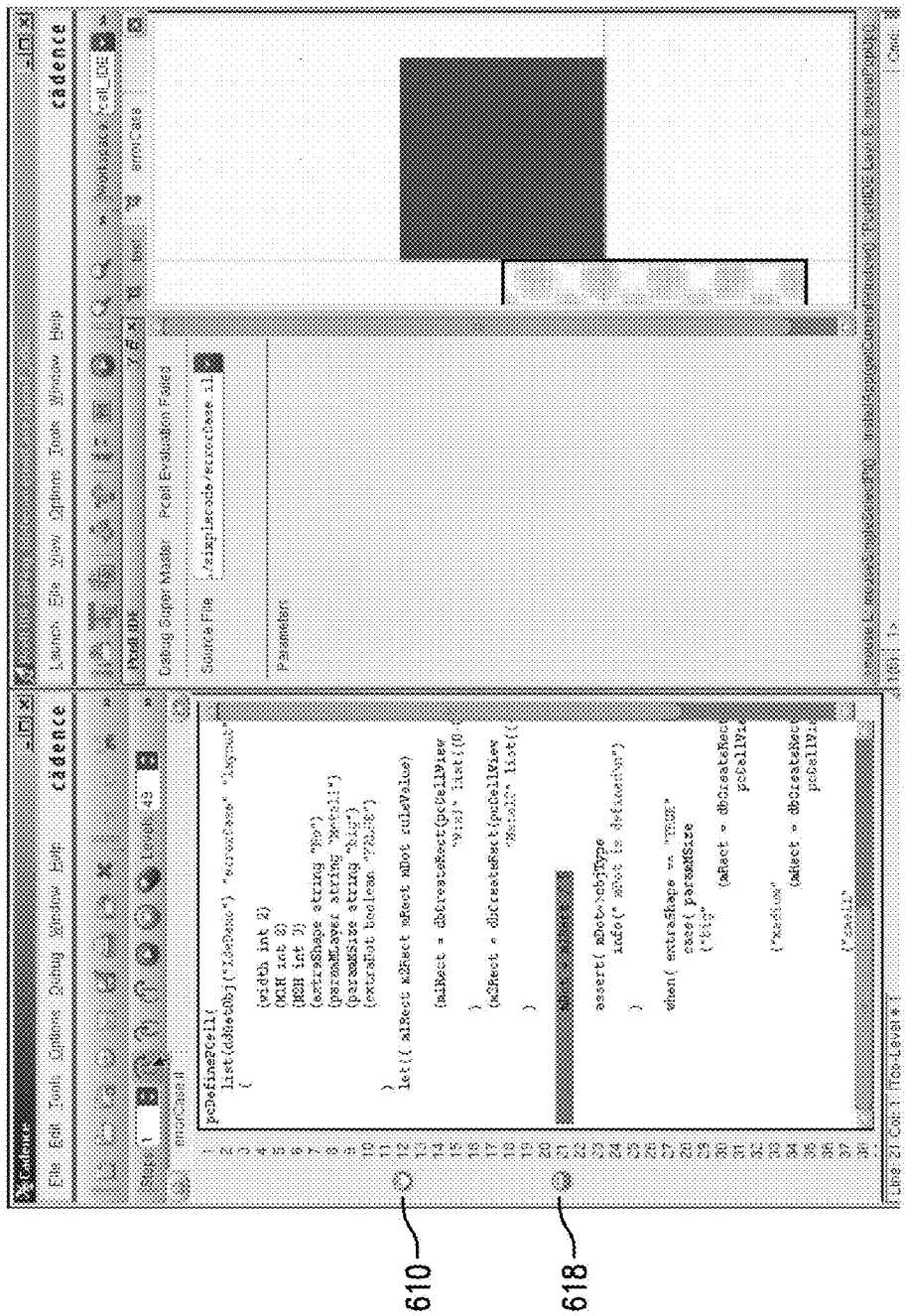
FIG. 6 is yet another exemplary user interface illustrating the debugging flow of the source code as it generates a layout with the parameterized cells (PCELLS)

FIG. 6 shows a further progression of the execution of the source code progressing past the break point 610 and stopping at a potentially problematic call 618. The problematic function, statement, or call 618 is highlighted or is otherwise indicated to the user as having a problem. In the illustrative example shown, the problematic call "mDot=m1Rect/5" has been highlighted in a conspicuous color, such as red, and an icon indicia corresponding with a line number of the call has been shown with graphical indicia 618 indicating an error. Such debugger may be programmed to preferably halt execution at an error or problematic system call 618 such that debugging may proceed. Additionally, an error message may be displayed and/or upon hovering over the problematic system call, a pop-up window or indicia of the error, such as "parameter unbound" may be displayed.

Figure 7:
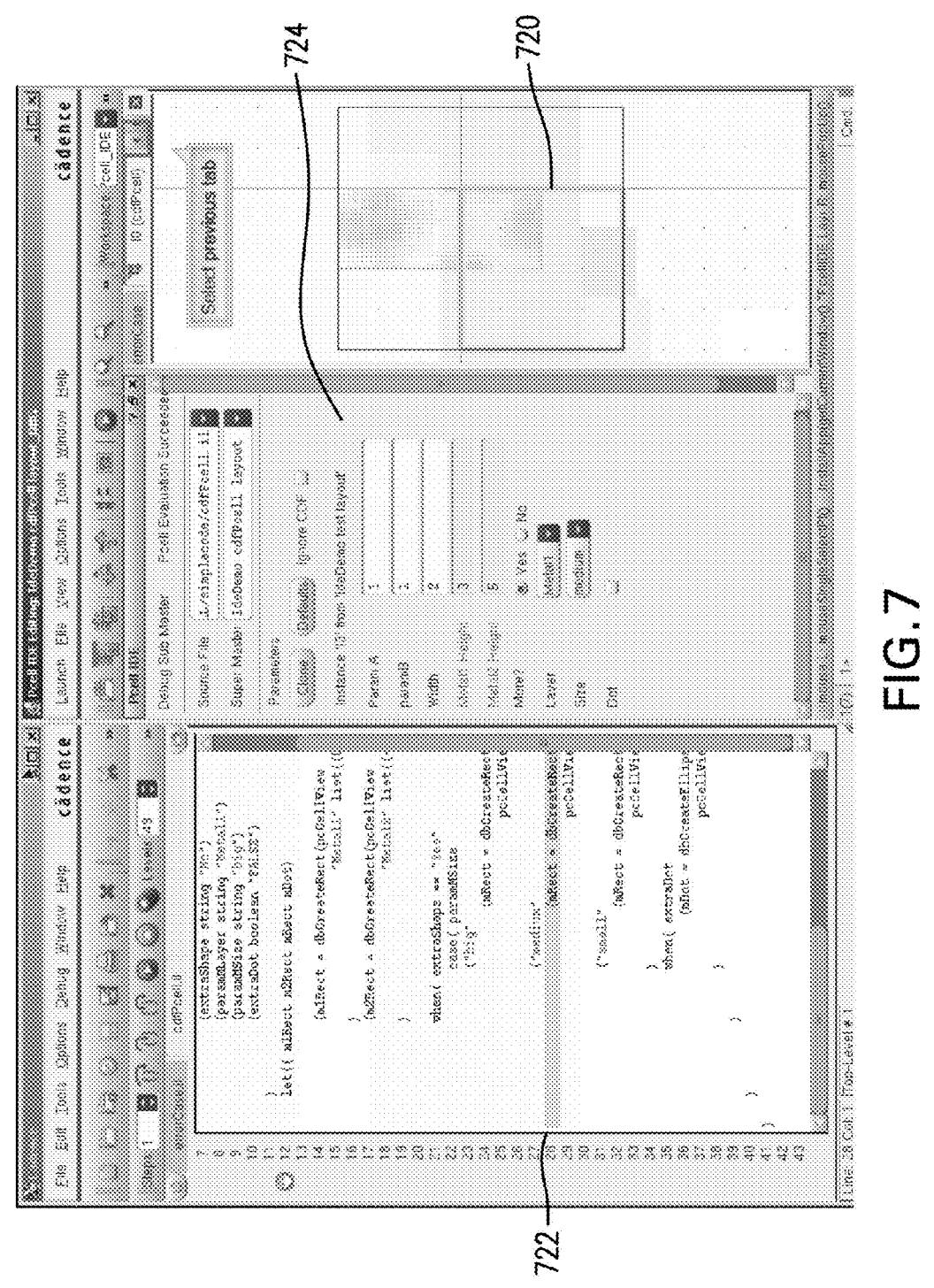

FIG. 7 shows a further progression of the source code where the current line of execution is shown at 722. The current line of code, located at line 28, shows another instance of a "dbCreateRect" instance. The dbCreateRect system call creates a rectangular geometric shape in the layout view. Such illustrative shape may be seen at block 720. Additionally, a user interface 724 may allow a user to manually set and override the parameters of the cell. Such manual settings of the parameters in the user interface 724 allows a user to manipulate different sizes and varying parameters such as width, length, height, levels, sizes, and the like.

Figure 8:
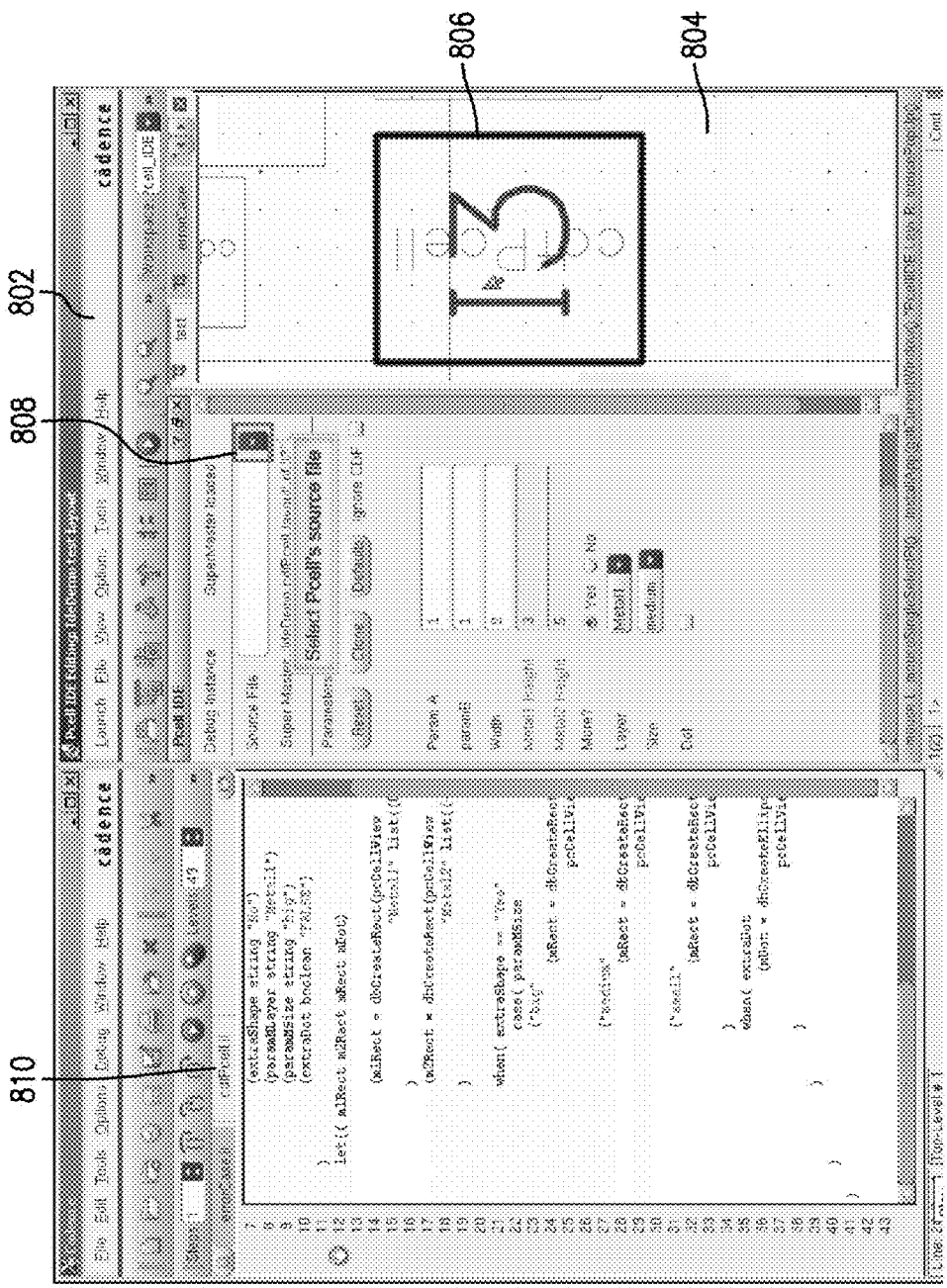
FIG. 8 is another exemplary user interface detailing the selection of another PCELL in a layout file and its corresponding source code.

FIG. 8 shows a condition of the user interface where a user has selected to go back to a generated test layout 802 where the layout view 804 shows a completely generated test layout file including geometric shapes representing the individual cell components thereof. An illustrative PCELL, PCELL 806 has been selected. Upon a user selection of a specific PCELL in the layout view 804, the user may be prompted with a source file input control 808 allowing the user to select a different source code file for the selected PCELL. In this exemplary instance however, the PCELL source code file has already been loaded, as indicated by the "cdfPcell.il" window 810 having already been loaded. Such previous loading of the source code may be indicated or determined by the fact that the source code is already visible.

Figure 9:
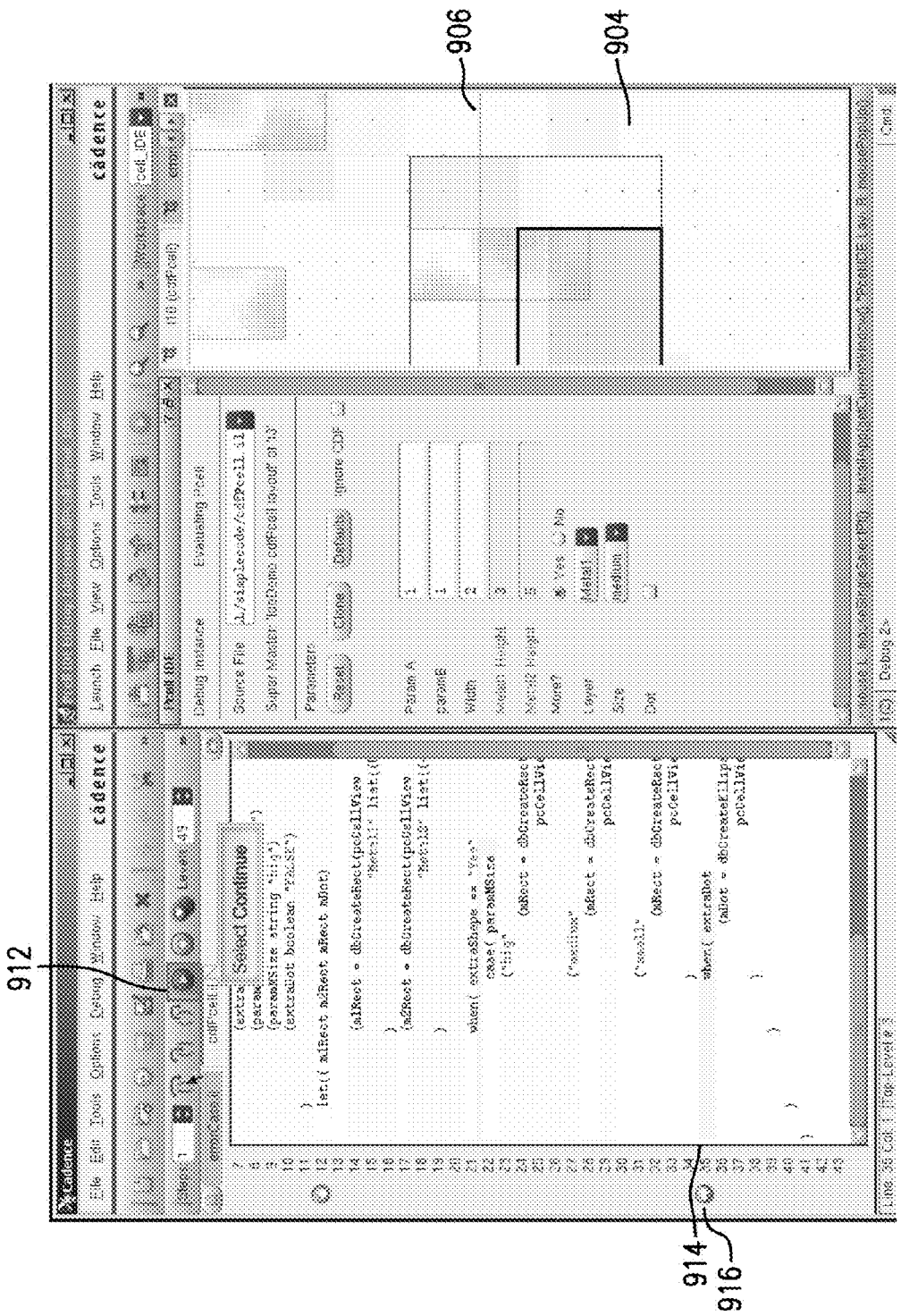
FIG. 9 is another exemplary user interface detailing a debugging flow of a PCELL in the layout and the changing of values of parameters associated therewith.

FIG. 9 shows a further progression of the source code and the corresponding further progression of the generation of the layout file as seen in layout 904. Additional cells, such as cell 906 have been generated due to the execution of the corresponding source code. It is seen that progression of the source code has arrived to line 35 seen as a 'when' command 914 having a graphical indicator 916 showing the current execution location. In the debugging process, the user may operate any of the controls such as continue 912 in the debugging user interface.

Figure 10:
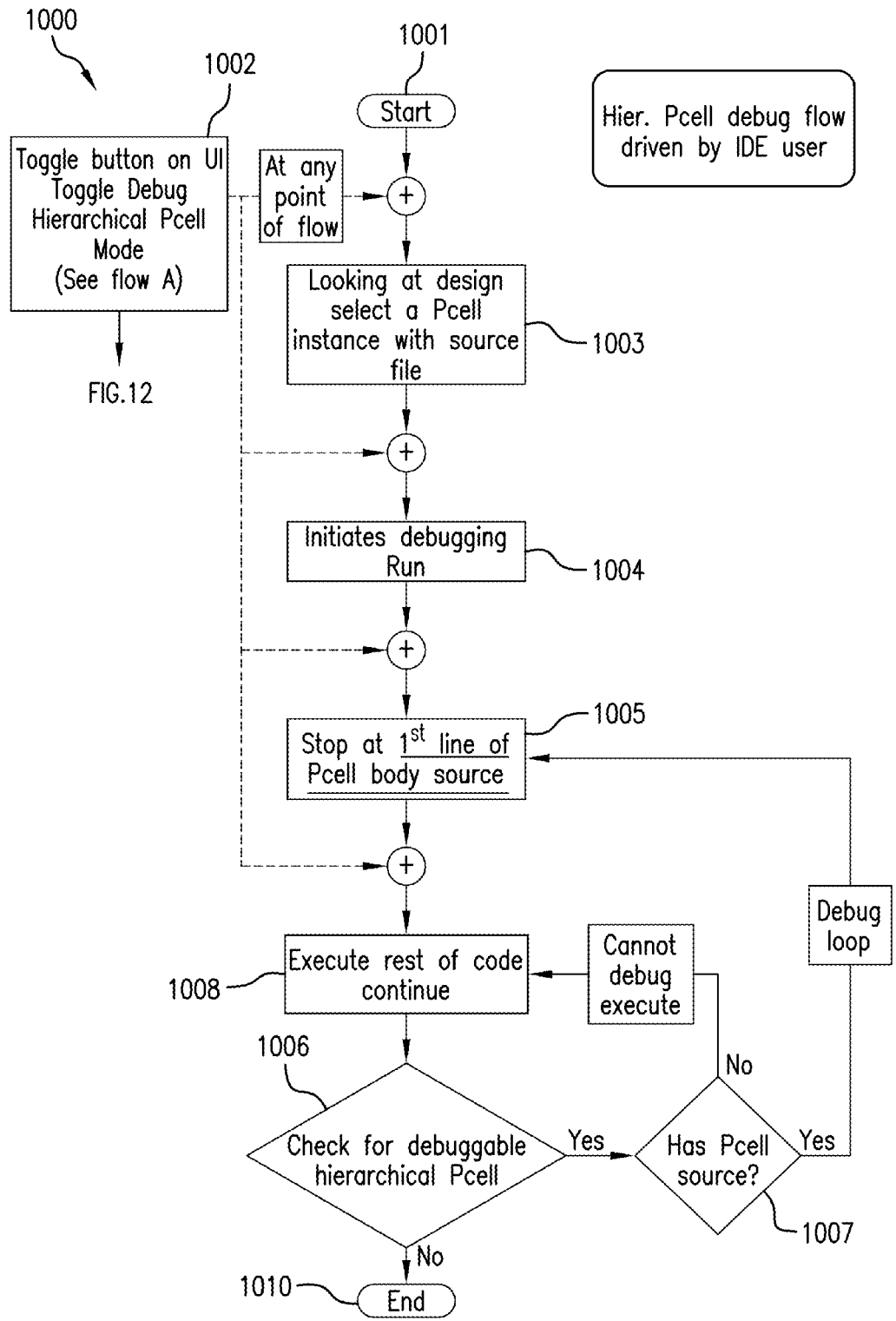
FIG. 10 is a simplified flow diagram illustrating an elaborated debugging flow of the test layout wherein the debugging flow is automatically driven.
Figures 12, 13:
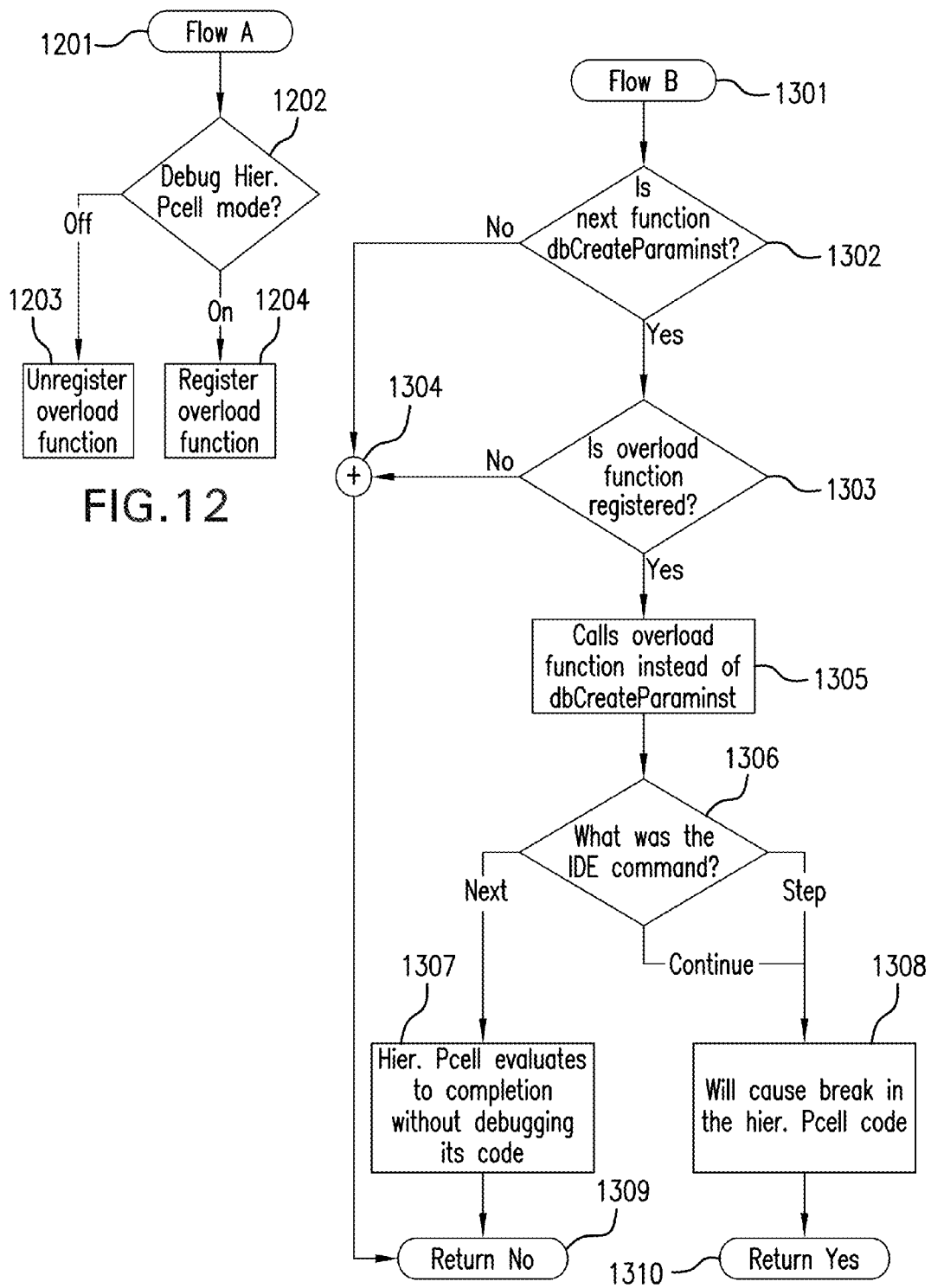
FIG. 12 is another simplified flow diagram illustrating an enablement of the debugging integrated design environment (IDE)
FIG. 13 is yet another simplified flow diagram illustrating an elaborated debugging flow of the test layout or silicon realization; and, FIG. 14 is a block diagram illustrating an exemplary interconnection of components in a processor-based system for implementing an exemplary embodiment of the present invention.

As seen in the simplified flow diagram of FIG. 10, a debugging process 1000 in conformance with an exemplary embodiment of the present invention is shown. The debugging process starts off at block 1001 where a test layout file is attempted to be generated. Alternatively, a listing, a mapping, or any other measure for displaying a list of different cells or PCELLS within a design, as would be known to one of skill in the art may be employed. From the list of cells, a user at block 1003 selects a specific instance of a PCELL and either chooses a corresponding source code file, portion, or the like, or such source file is automatically loaded for the user. At block 1002, a user may be able to toggle on, off, or cycle amongst different debugging modes for the hierarchical PCELL. A simplified flow for the toggling and determination of debugging mode enabled or disabled is shown in FIG. 12 in more detail. Such toggling of the debug hierarchical PCELL mode may be performed at any point between any of the blocks in the simplified flow diagram of FIG. 10. Specifically, it is shown that such user input may be accepted at any point, such as in between block 1001 and 1003, between 1003 and 1004, between 1004 and 1005, or additionally, between block 1005 and 1008.

At block 1004, the source code for instantiating the selected PCELL may be run. Alternatively, at least the supporting files, or the PCELLS in the hierarchical PCELL which the selected PCELL depends upon may be instantiated at this point. While such source code files are being run, the execution is arrested at block 1005 at the first line of the specific PCELL body source code for the selected PCELL. At block 1008, a user may intervene with continue, stop, step, step out of, or step into, progress control commands—or the integrated debugging/developing environment may automatically control the progression of the execution of the source code thereof. At block 1006, it is determined whether the selected PCELL within a hierarchical PCELL is debuggable. In a preferred embodiment, a hierarchical PCELL is debuggable if the PCELL source code is available. A user interface portion at block 1007 may query a user for the provision of such source code and if the user does not provide the corresponding source code to the selected PCELL, then it may not be possible to debug such selected PCELL; thereupon the flow continues to the continue block 1008 which again loops until either the user cancels the request for debugging or the user provides the source code. If the hierarchical PCELL is not debuggable, the user may hit the cancel button and proceed to an end block 1010. If, however, the user has provided the correct source code, then the progress will proceed back to block 1005 where the progress of the execution of that source code will stop at the first line of the PCELL body source. In alternate embodiments, the execution of such PCELL source code may not stop at the first line, but may stop at another predetermined location, such as after receiving a parametric component, after a setting a parametric component, after a complicated value manipulation of such parametric component, or the like, as would be known to one of skill in the art.

Figure 11:
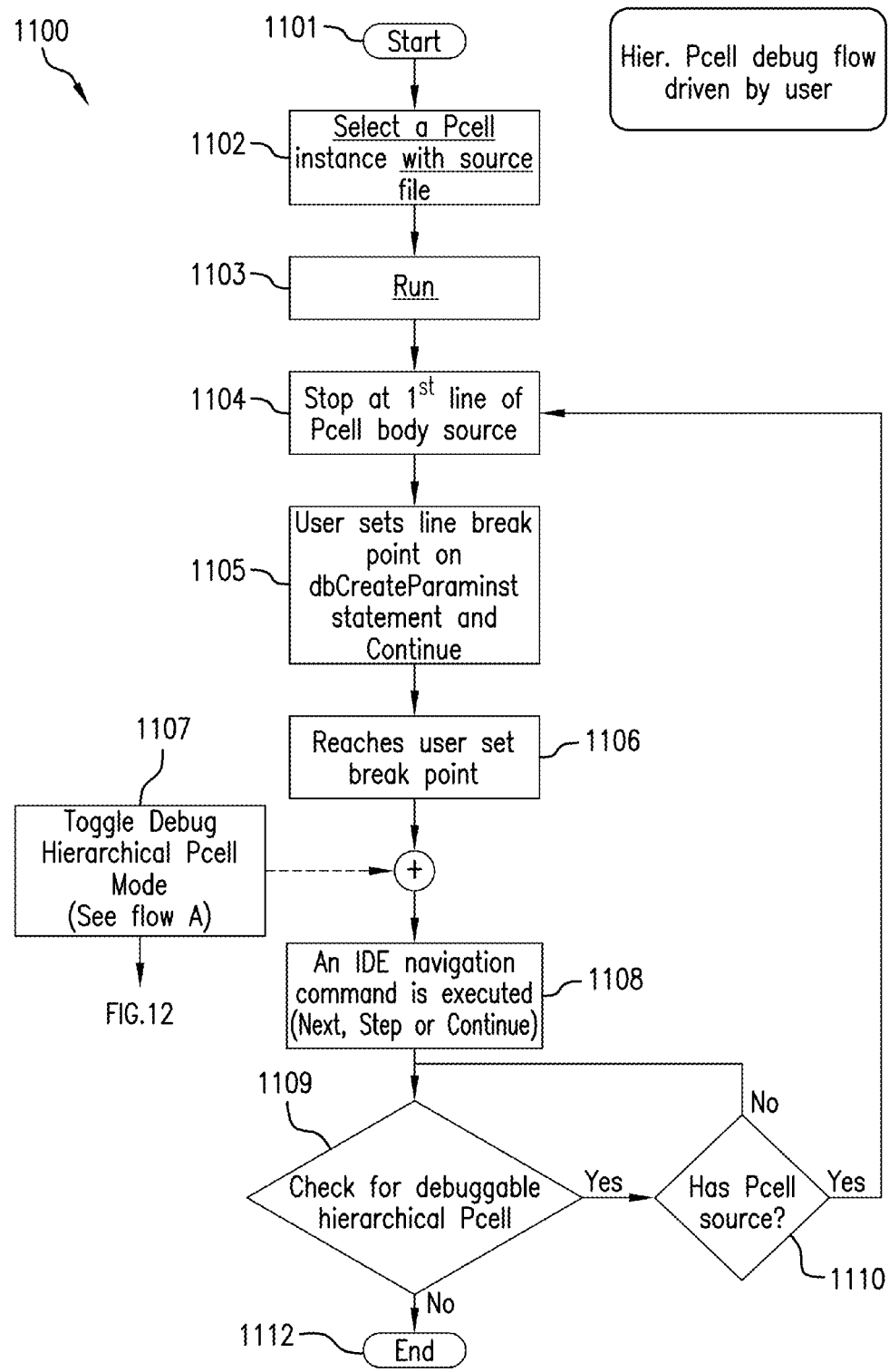
FIG. 11 is another simplified flow diagram illustrating an elaborated debugging flow of the test layout or silicon realization where the user takes a more manual approach to controlling the progression through the source code.

As seen in the simplified flow diagram of FIG. 11, a debugging process 1100 in conformance with an exemplary embodiment of the present invention is shown. The debugging process starts off at block 1101 and proceeds to block 1102 where a user or designer selects a PCELL instance with a source file. At 1103, the source file and any supportive source code files are run. At block 1104, the execution of such source code stops at the first line of the PCELL body source. Optionally, the relevant source code portion including the source code for the selected PCELL is shown to the user in a debugging user interface. In a preferred embodiment, other portions of source code that may be pre-established or supplementary to the user's PCELL source code may be selectively or intelligently hidden from the user. At block 1105, a user manipulates the source code to establish manually set break points. Such break points are preferably on function calls of the "dbCreateParamInst" statement and then the user selects a user interface control portion to continue the flow of the execution of the source code. At block 1106, the flow reaches the user's manually set break point and the execution of the source code is arrested at that point. At block 1107, the user is able to toggle a debug enable or disable control mechanism or measure. (Such flow is further detailed at FIG. 12.)

At block 1108, a debug user interface including a progress control portion is provided to a user allowing them to continue the flow of the execution source code, step one line of code or one command/statement, step one expression, or operate any available such similar commands, such as step within and the like. At block 1109, it is determined whether the selected PCELL is indeed debuggable. Such determination may be made, at least in part, by a determination of whether the user is able to supply a source code for such selected PCELL. Additionally, it may be determined whether the user has enabled the debugging mode and which debugging mode is enabled: e.g., automatic, IDE driven, or user driven. It may even further be determined whether the selected PCELL instance desired for debugging is indeed nested or within a hierarchical PCELL. If any of the conditions evaluated in decision block 1109 are negative, flow may progress to the ending block, block 1112. If, however, the determinations at block 1109 yield true or logical yes values, then the instance of the selected PCELL and the source code thereof, may be selected and loaded at block 1110. If such source code is not able to be loaded, then the flow may progress back to block 1109. If, however, the source code is determined to be available, then the flow progresses back to block 1104 for an iterative loop through a stopping at the first line of the PCELL body source code and allowing the user control over the setting of break points and the further progression of the execution of the source code thereof.

FIG. 12 illustrates a highly simplified flow diagram of a debug enabled mode determination. The flow begins at block 1201 and proceeds to block 1202 where it is determined where a hierarchical PCELL debugging mode is enabled. If indeed the hierarchical PCELL debug mode is enabled, then the flow proceeds to block 1204 where a register overload function may be utilized. For standard execution of a source code for a PCELL, the dbCreateParamInst may be used. Such dbCreateParamInst generally functions to instantiate a PCELL and does not break or arrest its execution at any point thereof, but merely seeks to instantiate the coded PCELL into a geometric shape in the layout. At block 1202, if it has been determined that the debugging mode is indeed enabled, then flow proceeds to 1204. In a preferred embodiment, the execution of the source code will utilize a different dbCreateParamInst, or an overloaded dbCreateParamInst registered with the debugger, such that the dbCreateParamInst function has debugging measures built therein. Such debugging measures provided in the overloaded dbCreateParamInst function may be achieved by providing a mirror function with additional debugging functionalities, and may be automatically detected upon the passing of a certain type of object or parameter—as opposed to a normal type of parameter or object which may ordinarily be passed to the dbCreateParamInst function. In an alternate embodiment, the underlying normal dbCreateParamInst functionality may be modified to accommodate the debugging. Alternatively, a different dbCreateParamInst function may be provided in the IDE and merely the calls to the standard dbCreateParamInst may be intercepted and redirected to the new dbCreateParamInst. At decision block 1202, if it is determined that the debug hierarchical PCELL mode is disabled, then the flow instead proceeds to block 1203 where the standard dbCreateParamInst function is utilized. Several exemplary measures may exist for utilizing the standard dbCreateParamInst, such as a de-registration, a redirection back to the ordinary dbCreateParamInst, or a modification of the standard dbCreateParamInst to remove the debugging functionality therefrom, and other similar measures.

As seen in FIG. 13, a simplified flow chart for the use of overloaded functions is illustrated. The flow begins at block 1301. At block 1302 the next function is identified and it is determined whether the identified function is 'dbCreateParamInst.' If a negative determination, then flow proceeds to a user input at block 1404 which ultimately proceeds to return 'NO' at block 1309. If however, the determination that the next function is 'dbCreateParamInst,' then the flow proceeds to block 1303 where it is determined if an overloaded function has been registered to perform debugging during the instantiation of the selected PCELL. If no function has been registered, then flow may proceed to block 1304. If, however, an overloaded 'dbCreateParamInst' has been registered, then the debugger proceeds to block 1305 and calls the overloaded debugging 'dbCreateParamInst' function to enable debugging of the source code for the selected PCELL. Another determination is made at block 1306, where the IDE command (e.g. Next, Step, Continue) is determined. If the IDE command 'Next' was issued (for example, by actuating the Next button of the progression control, then the flow proceeds to block 1307. At block 1307, the hierarchical PCELL executes or evaluates to completion without any further debugging and returns at block 1309. If the 'Step' command was issued then a break will be caused in the PCELL code at block 1308 by arresting the execution of the source code after the next line of code. If the 'Continue' command was issued then a break will be caused in the PCELL code at block 1308 by arresting the execution of the source code once another PCELL is instantiated, another breakpoint is encountered, or the code has executed to completion. The flow then proceeds to block 1310 and returns.

In various embodiments of the invention, the system may be implemented in the form of software modules or hardware modules. In an embodiment of the invention, the system is implemented as part of an electronic design automation (EDA) or integrated development environment (IDE) system.

Figure 14:
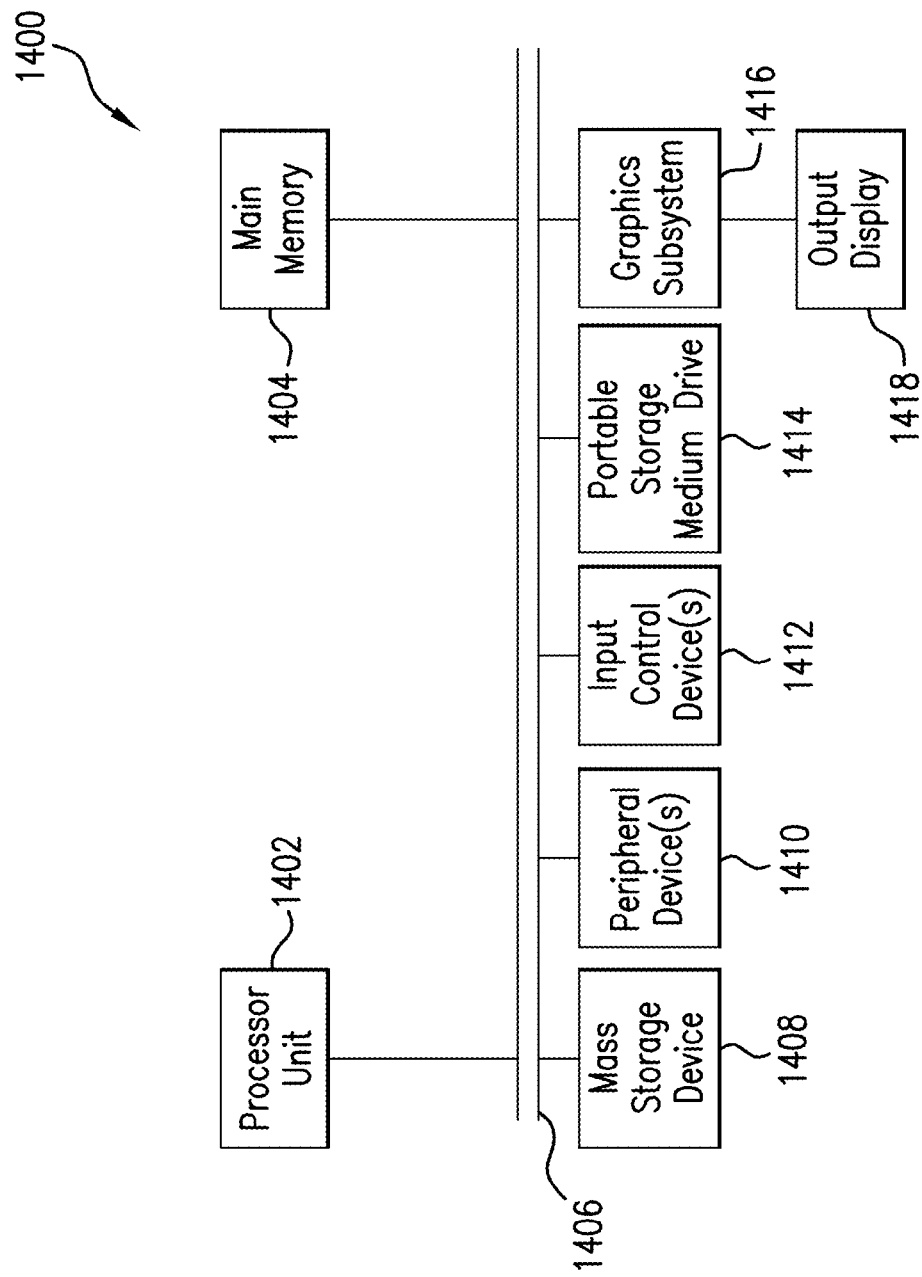

FIG. 14 illustrates a block diagram of a computer system for executing electronic design automation and integrated development environment debugging, in accordance with various embodiments of the present invention. A computer system 1400 contains a processor unit 1402, a main memory 1404, an interconnect bus 1406, a mass storage device 1408, peripheral device(s) 1410, input control device(s) 1412, portable storage drive(s) 1414, a graphics subsystem 1416, and an output display 1418. Processor unit 1402 may include a single microprocessor or a plurality of microprocessors for configuring computer system 1400 as a multi-processor system. Main memory 1404 stores, in part, instructions and data to be executed by processor 1402. Main memory 1404 preferably includes banks of dynamic random access memory (DRAM) as well as high-speed cache memory.

For the purpose of simplicity, the components of computer system 1400 are connected via interconnect bus 1406. However, computer system 1400 may be connected through one or more data transport means. For example, processor unit 1402 and main memory 1404 may be connected via a local microprocessor bus and mass storage device 1408, peripheral device(s) 1410, portable storage medium drive(s) 1414, and graphic subsystem 1416 may be connected via one or more input/output (I/O) busses. Mass storage device 1408, which may be implemented with a magnetic disk drive, an optical disk drive, a solid state device, an attachment to network storage, and the like, is preferably a non-volatile storage device for storing data, databases, and instructions, to be used by processor unit 1402. In a software embodiment, mass storage device 1408 may store the software to load it into main memory 1404.

Portable storage medium drive 1414 operates in conjunction with a portable non-volatile storage medium such as a floppy disk, a compact disk read only memory (CD-ROM), or a digital versatile disk read only memory (DVD-ROM), to input and output data and code to and from the computer system 1400. In one embodiment, the software is stored on such a portable medium, and is input to computer system 1400 via portable storage medium drive 1414. Peripheral device(s) 1410 may include any type of computer support device such as an input/output (I/O) interface, to add additional functionality to computer system 1400. For example, peripheral device(s) 1410 may include a network interface card to interface computer system 1400 to a network.

Input control device(s) 1412 provide a portion of the user interface for a computer system 1400 user. Input control device(s) 1412 may include an alphanumeric keypad for inputting alphanumeric and other key information; and a cursor control device such as a mouse, a track pad or stylus; or cursor direction keys.

In order to display textual and graphical information, computer system 1400 contains graphic subsystem 1414 and output display(s) 1418. Output display 1418 may include a cathode ray tube (CRT) display, liquid crystal display (LCD), plasma display, projector, or the like. Graphic subsystem 1416 receives textual and graphical information and processes the information for output to display 1418.

In a software implementation, the EDA software includes a plurality of computer executable instructions, to be implemented on a computer system. Prior to loading in the computer system, the EDA software may reside as encoded information on a computer-readable tangible medium such as a magnetic floppy disk, a magnetic tape, CD-ROM, DVD-ROM, flash memory, or any other suitable computer readable medium.

In a hardware implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

Thereby a designer with minimal effort, expended time, reduced chance of errors, and reduced costs may have an automated system and method for debugging hierarchical PCELLS.

Although this invention has been described in connection with specific forms and embodiments thereof, it will be appreciated that various modifications other than those discussed above may be resorted to without departure from the spirit or scope of the invention. For example, equivalent elements may be substituted for those specifically shown and described, certain features may be used independently of other features, and in certain cases, particular combinations of circuit design and implementation flows or processing steps may be reversed or interposed, all without departing from the spirit or scope of the invention as defined in the appended Claims.

What is claimed is:

1. A method for establishing a debugging user interface for a cell within an interdependent hierarchy of cells in an integrated circuit (IC) layout, comprising:
    establishing a data store of source code portions, each source code portion defining at least part of a cell;
    actuating a user interface to accept a user selection of at least one cell in an integrated circuit (IC) layout, the layout including at least one hierarchical cell having a hierarchy of subordinate cells formed therein, each subordinate cell being collectively defined by a corresponding source code portion in the data store and at least one parametric component derived from at least one other cell within the hierarchy;
    actuating a computer processor to:
        identify a source code portion corresponding to the selected cell;
        establish a breakpoint, responsive to the user selection, at a predetermined location of the source code portion corresponding to the selected cell;
        execute a set of source code portions to establish at least a portion of the hierarchical cell containing the selected cell to generate a value for at least one parametric component of the selected cell identifying a set of other cells in the hierarchy of cells and a set of their corresponding source code portions required to generate parametric component values for the selected cell;
        arrest execution at the breakpoint;
        display to a user the source code portion corresponding to the selected cell and the value for the at least one parametric component of the selected cell.

2. The method as recited in claim 1, wherein the selected cell is a parameterized cell (PCELL) disposed within a hierarchical PCELL.

3. The method as recited in claim 1, further comprising generating the integrated circuit (IC) layout from a schematic and a plurality of source code portions in the data store.

4. The method as recited in claim 1, further comprising: executing the set of source code portions to generate parametric component values for the selected cell.

5. The method as recited in claim 1, further comprising: detecting a predetermined cell manipulation function in the identified source code portion corresponding to the selected cell and establishing a breakpoint thereat.

6. The method as recited in claim 1, further comprising: establishing a user interface and accepting an input location of a source code portion for the selected cell.

7. The method as recited in claim 1, further comprising: establishing a progress control user interface and accepting progress control commands from a user.

8. The method as recited in claim 1, further comprising: registering alternate cell manipulation functions invoked in the source code portion corresponding to the selected cell to thereby execute the alternate cell manipulation function during execution of the source code portion corresponding to the selected cell.

9. The method as recited in claim 1, further comprising: modifying cell manipulation functions invoked in the source code portion corresponding to the selected cell to thereby arrest execution.

10. A method for establishing a debugging user interface for a hierarchical cell instantiation, comprising:
    establishing a data store of source code portions, each source code portion defining a cell template, the source code portions being executable to establish cells in an Integrated Circuit (IC) design based on a corresponding cell template;
    providing an IC design, the IC design including at least one hierarchical cell having a hierarchy of levels contained therein of dependent cells, each said dependent cell being collectively defined by a cell template in the data store and at least one parametric component derived from an evaluation of at least one other cell within the hierarchical cell;
    actuating a user interface to accept a selection of at least one cell within a hierarchical cell in the IC design;
    actuating a computer processor to:
        identify a set of cells that the selected cell depends upon;
        load a set of source code portions including at least the source code portion corresponding to the selected cell and the identified set of cells;
        execute at least a part of the set of source code portions to generate a value of at least one parametric component for the selected cell identifying a set of other cells in the hierarchy of cells and a set of their corresponding source code portions required to generate parametric component values for the selected cell;
        arrest execution of the set of source code portions at a predetermined location therein; and,
        actuate the user interface to display:
            the source code portion corresponding to the selected cell, and,
            the value of the at least one parametric component of the selected cell derived from an evaluation of at least one other cell within the hierarchical cell.

11. The method as recited in claim 10, wherein the selected cell is a parameterized cell (PCELL) disposed within a hierarchical PCELL.

12. The method as recited in claim 11, wherein the IC design is a layout.

13. The method as recited in claim 12, further comprising generating the integrated circuit (IC) layout from a schematic and a plurality of source code portions in the data store.

14. The method as recited in claim 13, further comprising: detecting a predetermined PCELL manipulation function in the identified source code portion corresponding to the selected PCELL and arresting execution thereat.

15. The method as recited in claim 14, further comprising: establishing a user interface and accepting an input location of a source code portion for the selected cell.

16. The method as recited in claim 15, further comprising: establishing a progress control user interface and accepting execution progress control commands from a user.

17. The method as recited in claim 11, further comprising: registering at least one alternate PCELL manipulation function invoked in the source code portion corresponding to the selected PCELL to thereby execute the registered PCELL manipulation function during execution of the source code portion corresponding to the selected PCELL.

18. The method as recited in claim 11, further comprising: modifying at least one PCELL manipulation function invoked in the source code portion corresponding to the selected PCELL to thereby arrest execution.

19. A system for automatically guiding debugging of a computer program operable to generate an integrated circuit (IC) design, comprising:
- a memory storing a plurality of source code portions, each source code portion defining at least part of a cell;
- a user interface functionally coupled to the memory and operable to accept a selection from a user of at least one cell in an integrated circuit (IC) layout, the layout including at least one hierarchical cell having a hierarchy of subordinate cells formed therein, each subordinate cell being collectively defined by a corresponding source code portion in the memory and at least one parametric component derived from at least one other cell within the hierarchy;
- a computer processor functionally coupled to the user interface and memory, the computer processor being operable to:
  - identify a source code portion in the memory corresponding to the selected cell;
  - establish a breakpoint, responsive to the user selection, at a predetermined location of the source code portion corresponding to the selected cell;
  - execute a set of source code portions to establish at least a portion of the hierarchical cell containing the selected cell to generate a value for at least one parametric component of the selected cell identifying a set of other cells in the hierarchy of cells and a set of their corresponding source code portions required to generate parametric component values for the selected cell;
  - arrest execution at the breakpoint;
  - display to a user the source code portion corresponding to the selected cell and the value for the at least one parametric component of the selected cell via the user interface.

20. The system as recited in claim 19, wherein the selected cell is a parameterized cell (PCELL) disposed within a hierarchical PCELL.

21. The system as recited in claim 20, wherein the computer processor is further operable to register alternate PCELL manipulation functions invoked in the source code portion corresponding to the selected PCELL to thereby execute the registered PCELL manipulation function during execution of the source code portion corresponding to the selected PCELL.

22. The method as recited in claim 20, wherein the computer processor is further operable to: modify at least one PCELL manipulation function invoked in the source code portion corresponding to the selected PCELL to thereby arrest execution.

* * * * *

UNITED STATES PATENT AND TRADEMARK OFFICE
CERTIFICATE OF CORRECTION

PATENT NO. : 8,719,745 B2  
APPLICATION NO. : 13/686560  
DATED : May 6, 2014  
INVENTOR(S) : Li-Chien Ting et al.

Page 1 of 1

It is certified that error appears in the above-identified patent and that said Letters Patent is hereby corrected as shown below:

In the Claims:  
Claim 1 at Column 15, line 34 as follows:  
between "selected cell" and "identifying", Insert --";"-- and a line break.

Claim 10 at Column 16, line 28 as follows:  
between "selected cell" and "identifying", Insert --";"-- and a line break.

Claim 19 at Column 17, line 26 as follows:  
between "selected cell" and "identifying", Insert --";"-- and a line break.

Signed and Sealed this  
First Day of July, 2014

Michelle K. Lee  
*Deputy Director of the United States Patent and Trademark Office*